United States Patent
Bi et al.

(10) Patent No.: US 12,205,623 B2
(45) Date of Patent: Jan. 21, 2025

(54) CACHE MEMORY AND METHOD OF ITS MANUFACTURE

(71) Applicant: INSTITUTE OF MICROELECTRONICS, CHINESE ACADEMY OF SCIENCES, Beijing (CN)

(72) Inventors: Chong Bi, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 187 days.

(21) Appl. No.: 18/004,968

(22) PCT Filed: Jul. 20, 2020

(86) PCT No.: PCT/CN2020/102990
§ 371 (c)(1),
(2) Date: Jan. 10, 2023

(87) PCT Pub. No.: WO2022/016313
PCT Pub. Date: Jan. 27, 2022

(65) Prior Publication Data
US 2023/0245691 A1    Aug. 3, 2023

(51) Int. Cl.
*G11C 11/16* (2006.01)
*H10B 61/00* (2023.01)
(Continued)

(52) U.S. Cl.
CPC ........ *G11C 11/161* (2013.01); *G11C 11/1659* (2013.01); *G11C 11/1673* (2013.01);
(Continued)

(58) Field of Classification Search
CPC .............. G11C 11/161; G11C 11/1659; G11C 11/1673; G11C 11/1675; H10B 61/22;
(Continued)

(56) References Cited

U.S. PATENT DOCUMENTS 7,573,736 B2 * 8/2009 Wang .................... G11C 11/161
                                                    365/158
9,984,735 B2 * 5/2018 Yamane ................. H10N 50/85
(Continued)

FOREIGN PATENT DOCUMENTS

CN         1435841 A    8/2003
CN       104393169 B    1/2017

OTHER PUBLICATIONS

International Search Report and Written Opinion for International Patent Application No. PCT/CN2020/102990 dated Apr. 15, 2021, 9 pages with English Translation.

*Primary Examiner* — Ly D Pham
(74) *Attorney, Agent, or Firm* — Christopher R. Christenson; Kelly, Holt & Christenson, P.L.L.C.

(57) ABSTRACT

Provided is a cache memory, including: a first field-effect transistor, a field-like spin torque layer underneath a magnetic tunnel junction, an electrode, and a second field-effect transistor sequentially arranged and connected; wherein the first field-effect transistor is configured to provide a writing current and to control the on-off of the writing current through a gate electrode; the field-like spin torque layer is configured to generate field-like spin torques for switching a first ferromagnetic layer of the magnetic tunnel junction; the magnetic tunnel junction includes a first ferromagnetic layer, a tunneling layer, a second ferromagnetic layer and a pinning layer arranged sequentially; the electrode is configured to connect the cache memory with the second field-effect transistor; and the second field-effect transistor is configured to control the on-off of the second field-effect
(Continued)

transistor through the gate electrode to read the resistive state of the magnetic tunnel junction.

9 Claims, 5 Drawing Sheets

(51) Int. Cl.
    *H10N 50/01*     (2023.01)
    *H10N 50/20*     (2023.01)
    *H10N 50/80*     (2023.01)
    *H10N 50/85*     (2023.01)

(52) U.S. Cl.
    CPC .......... *G11C 11/1675* (2013.01); *H10B 61/22* (2023.02); *H10N 50/01* (2023.02); *H10N 50/20* (2023.02); *H10N 50/80* (2023.02); *H10N 50/85* (2023.02)

(58) Field of Classification Search
    CPC ........ H10N 50/80; H10N 50/20; H10N 50/01; H10N 50/85
    USPC .......................................................... 365/158
    See application file for complete search history.

(56) References Cited

U.S. PATENT DOCUMENTS

| | | | |
|---|---|---|---|
| 11,165,013 B2* | 11/2021 | Garello | H10N 50/01 |
| 2004/0233746 A1 | 11/2004 | Kumar et al. | |
| 2008/0310214 A1* | 12/2008 | Wang | G11C 11/1675 365/158 |
| 2010/0032778 A1* | 2/2010 | Lu | H10N 50/10 257/E43.001 |
| 2010/0080036 A1* | 4/2010 | Liu | G11C 11/16 365/171 |
| 2013/0033931 A1* | 2/2013 | Yamane | G11C 11/1675 365/171 |
| 2019/0006415 A1* | 1/2019 | Li | G11C 11/1673 |
| 2020/0203601 A1* | 6/2020 | Eom | H10N 50/85 |

* cited by examiner

CACHE MEMORY AND METHOD OF ITS MANUFACTURE

CROSS-REFERENCE TO RELATED APPLICATION

This application is a Section 371 National Stage Application of International Application No. PCT/CN2020/102990, filed on Jul. 20, 2020, entitled "CACHE MEMORY AND METHOD OF ITS MANUFACTURE", the content of which is hereby incorporated by reference in its entirety.

TECHNICAL FIELD

The present disclosure relates to a field of cache technology, and in particular, to a cache memory and a method of its manufacture.

BACKGROUND

Cache memory is an important part of Central Processing Unit (CPU), and directly determines the data processing speed of a logical circuit part of CPU and an overall performance of CPU. In current storage systems, static random-access memory (SRAM) is usually used as the cache. However, a single cell of SRAM generally requires six field-effect transistors. In advanced semiconductor technology nodes, the cell size of SRAM cannot be further reduced, and the integration level of SRAM has reached its physical limit. At the same time, SRAM requires a constant voltage to maintain its data, which consumes a lot of power. A spin-transfer torque based magnetic random-access memory (STT-MRAM) may not meet the reading and writing requirements of cache since the writing time is more than 10 nanoseconds.

SUMMARY

The main objective of the present disclosure is to provide a cache memory and a method of its manufacture, which may improve the writing speed of magnetic memories.

In order to achieve the above-mentioned objective, the first aspect of embodiments of present disclosure provides a cache memory, including a first field-effect transistor, a field-like spin torque layer underneath a magnetic tunnel junction, an electrode, and a second field-effect transistor sequentially arranged and connected; wherein,
  the first field-effect transistor is configured to provide a writing current and to control the on-off of writing current through a gate electrode; the field-like spin torque layer is configured to generate field-like spin torques for switching a first ferromagnetic layer of the magnetic tunnel junction;
  wherein the field-like spin torques are generated when the writing current flows through the field-like spin torque layer and also an interface between the field-like spin torque layer and the first ferromagnetic layer of the magnetic tunnel junction;
  the magnetic tunnel junction includes a first ferromagnetic layer, a tunneling layer, a second ferromagnetic layer and a pinning layer arranged sequentially, wherein the first ferromagnetic layer is configured to generate a variable first magnetization direction based on the field-like spin torques generated by the underneath field-like spin torque layer; the tunneling layer is arranged between the first ferromagnetic layer and the second ferromagnetic layer; the second ferromagnetic layer is configured to have a fixed second magnetization direction; and the pinning layer is configured to maintain the second magnetization direction;
  the electrode is configured to connect the magnetic tunnel junction with the second field-effect transistor; and
  the second field-effect transistor is configured to control the on-off of the second field-effect transistor through the gate electrode to read resistive states;
  Optionally, when a data writing process is performed, the first field-effect transistor is turned on and the second field-effect transistor is turned off; and
  when a data reading process is performed, the first field-effect transistor is turned off and the second field-effect transistor is turned on.
  Optionally, both of the magnetization direction of the first ferromagnetic layer and the magnetization direction of the second ferromagnetic layer are in-plane. Optionally, a material of the field-like spin torque layer is nonferromagnetic, including platinum, tantalum, wolfram, titanium, ruthenium, molybdenum, Cu, RuO, doped semiconductors, or conducting oxides.
  Optionally, a thickness of the field-like spin torque layer is between 0.5 nm and 20 nm.
  Optionally, each of the first ferromagnetic layer and the second ferromagnetic layer is an alloy or a multilayer heterostructure containing at least one of iron, cobalt, nickel, or boron.
  Optionally, the magnetic tunnel junction further includes a coupling layer,
    wherein the coupling layer is arranged between the second ferromagnetic layer and the pinning layer, and configured to transfer a pinning effect of the pinning layer to the second ferromagnetic layer.
  Optionally, a surface of the cache memory is covered with a protective layer;
    the protective layer is configured to protect the cache memory from being affected by oxygen humidity; and
    a material of the protective layer is a non-magnetic metal or an alloy of doped semiconductor.
  Optionally, the pinning layer is a multilayer film structure including at least one antiferromagnetic layer.

The second aspect of embodiments of the present disclosure provides a method of manufacturing the cache memory described in the first aspect of embodiments of the present disclosure, including:
  preparing power supply and control circuits that include a first field-effect transistor and a second field-effect transistor on a substrate;
  flattening an upper surface of the substrate having the first field-effect transistor and the second field-effect transistor;
  growing a field-like spin torque layer, a first ferromagnetic layer, a tunneling layer, a second ferromagnetic layer, a coupling layer, a pinning layer and a protective layer on the flat substrate;
  patterning the field-like spin torque layer, the first ferromagnetic layer, the tunneling layer, the second ferromagnetic layer, the coupling layer, the pinning layer, the protective layer and an electrode, and ensuring an integrity of all layers;
  filling an oxide protective layer around the patterned cache memory; and
  plating an electrode to the cache memory to connect the pinning layer with the second field-effect transistor.

REFERENCE SIGNS

10—first field-effect transistor, 11—field-like spin torque layer, 12—first ferromagnetic layer, 13—tunneling layer, 14—second ferromagnetic layer, 15—coupling layer, 16—pinning layer, 17—electrode, 18—second field-effect transistor.

DETAILED DESCRIPTION OF EMBODIMENTS

In order to make objectives, features and advantages of the present disclosure more apparent and understandable, technical solutions in embodiments of the present disclosure will be described clearly and completely in combination with the accompanying drawings in embodiments of the present disclosure. Obviously, the described embodiments are merely part of embodiments of the present disclosure, and not all embodiments. Based on embodiments in the present disclosure, all other embodiments obtained by those skilled in the art without creative labor belong to the protection scope of the present disclosure.

In the embodiment, a first ferromagnetic layer 12, a tunneling layer 13, and a second ferromagnetic layer 14 together form an existing simple magnetic tunnel junction, and high and low resistance states of the magnetic tunnel junction depend on whether magnetization directions of the first ferromagnetic layer 12 and the second ferromagnetic layer 14 are consistent. When the magnetization directions of the first ferromagnetic layer 12 and the second ferromagnetic layer 14 are parallel, the magnetic tunnel junction is in the low resistance state, and when the magnetization directions of the first ferromagnetic layer 12 and the second ferromagnetic layer 14 are antiparallel, the magnetic tunnel junction is in the high resistance state.

In the embodiment, in an entire data writing and reading process, the magnetization direction of the second ferromagnetic layer 14 remains unchanged, and the writing current may implement the conversion of high and low resistance states by changing the magnetization direction of the first ferromagnetic layer 12.

In the embodiment, in the field-effect transistor, a gate electrode is connected to a word line. When the word line is high level, the field-effect transistor is tuned on, and when the word line is low level, the field-effect transistor is tuned off.

Figure 1:
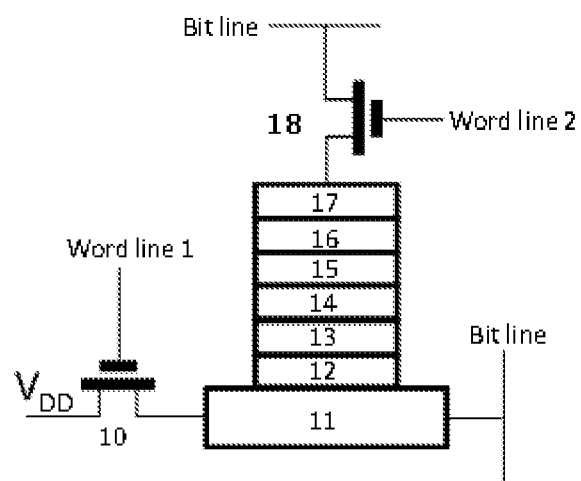
FIG. 1 shows a structure diagram of a cache memory provided in an embodiment of the present disclosure.

Referring to FIG. 1, FIG. 1 shows a structure diagram of a cache memory provided in an embodiment of the present disclosure. As shown in FIG. 1, the cache memory includes a first field-effect transistor 10, a field-like spin torque layer 11 underneath a magnetic tunnel junction, an electrode 17, and a second field-effect transistor 18 sequentially arranged and connected.

The first field-effect transistor 10 is configured to provide a writing current and to control the on-off of writing current through the gate electrode.

The field-like spin torque layer is configured to generate field-like spin torques for switching a first ferromagnetic layer of the magnetic tunnel junction.

The field-like spin torques are generated when the writing current flows through the field-like spin torque layer and also an interface between the field-like spin torque layer and the first ferromagnetic layer of the magnetic tunnel junction.

The magnetic tunnel junction includes a first ferromagnetic layer 12, a tunneling layer 13, a second ferromagnetic layer 14 and a pinning layer 16 arranged sequentially. The first ferromagnetic layer 12 is configured to generate a variable first magnetization direction based on the field-like spin torques generated by the underneath field-like spin torque layer. The tunneling layer 13 is arranged between the first ferromagnetic layer 12 and the second ferromagnetic layer 14. The second ferromagnetic layer 14 is configured to have a fixed second magnetization direction. The pinning layer 16 is configured to maintain the second magnetization direction.

The electrode 17 is configured to connect the cache memory with the second field-effect transistor 18.

The second field-effect transistor 18 is configured to control the on-off of the second field-effect transistor 18 through a gate electrode to read resistive states.

Optionally, the cache memory is an in-plane magnetization SOT-type MRAM based cache.

According to the embodiment, the first field-effect transistor 10 controls the on-off of the writing current through the gate electrode (Word Line 1 in FIG. 1) to implement a writing operation of the current. The second field-effect transistor 18 controls the on-off of the second field-effect transistor 18 through the gate electrode (Word Line 2 in FIG. 1) to read the high and low resistance states of the cache memory and implement a data reading process. The high and low resistance states of the cache memory depend on whether the magnetization directions of the first ferromagnetic layer 12 and the second ferromagnetic layer 14 are consistent. When the magnetization directions of the first ferromagnetic layer 12 and the second ferromagnetic layer 14 are parallel, the magnetic tunnel junction is in the low resistance state, and when the magnetization directions of the first ferromagnetic layer 12 and the second ferromagnetic layer 14 are antiparallel, the magnetic tunnel junction is in the high resistance state. In an entire writing and reading process, the magnetization direction of the second ferromagnetic layer 14 remains unchanged, and the writing current may implement the conversion of high and low resistance states by changing the magnetization direction of the first ferromagnetic layer 12.

In an embodiment of the present disclosure, when the data writing process is performed, the first field-effect transistor 10 is turned on and the second field-effect transistor 18 is turned off; and when the data reading process is performed, the first field-effect transistor 10 is turned off and the second field-effect transistor 18 is turned on.

Specifically, in the data writing process, the field-like spin torques are generated when the writing current flows through the field-like spin torque layer and also the interface between the field-like spin torque layer and the first ferromagnetic layer 12, and the field-like spin torques implement the switching of the magnetization direction of the first ferromagnetic layer 12. In the data reading process, the reading current reads a resistance of the magnetic tunnel junction through the magnetic tunnel junction.

More specifically, the first field-effect transistor 10 and the second field-effect transistor 18 are both metal oxide semiconductor field-effect transistor (MOSFET) or finned field-effect transistor (FinFET).

Figure 2:
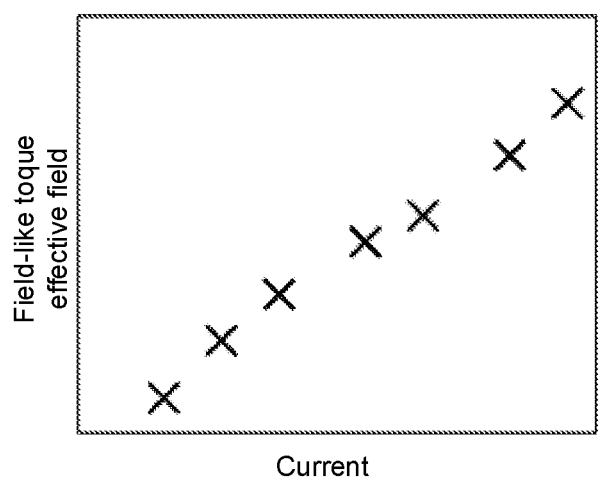
FIG. 2 shows a schematic diagram of a relationship between field-like spin torques and a current provided in an embodiment of the present disclosure.
Figure 3:
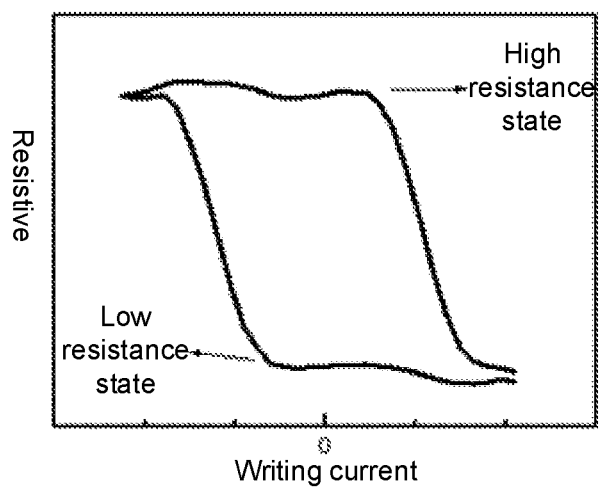
FIG. 3 shows a schematic diagram of a relationship between a writing current and high and low resistance states of a magnetic tunnel junction provided in an embodiment of the present disclosure.

Specifically, the magnetic tunnel junction includes first ferromagnetic layer 12, a tunneling layer 13, a second ferromagnetic layer 14 and a pinning layer 16 arranged sequentially. When the current passes through the interface between the field-like spin torque layer 11 and the first ferromagnetic layer 12, since the interface destroys the reversal symmetry at the interface of the first ferromagnetic layer 12, the spin torques generated inside the first ferromagnetic layer 12 no longer cancel each other, thus generating a field-like spin torque, which may directly switch the magnetization direction of the first ferromagnetic layer 12. Referring to FIG. 2, since the direction of the field-like spin torque is related to the direction of the current passing through the interface, the switching of the magnetization direction of the first ferromagnetic layer 12, i.e., the conversion of high and low resistance states, may be implemented by controlling the direction of the current at the interface. Referring to FIG. 3, the effect of field-like spin torques on the first ferromagnetic layer 12 is equivalent to applying an external magnetic field, so that the switching of the magnetization direction is very fast, and the writing process may be less than 0.5 nanosecond.

In an embodiment of the present disclosure, the material of the field-like spin torque layer is nonferromagnetic.

Specifically, the nonferromagnetic may be, for example, platinum (Pt), tantalum (Ta), wolfram (W), titanium (Ti), ruthenium (Ru), molybdenum (Mo), and the like.

Optionally, a thickness of the field-like spin torque layer is between 0.5 nm and 20 nm.

In an embodiment of the present disclosure, each of the first ferromagnetic layer 12 and the second ferromagnetic layer 14 is an alloy or a multilayer heterostructure containing at least one of Fe, Co, Ni or B.

Optionally, a thickness of the first ferromagnetic layer 12 and the second ferromagnetic layer 14 is between 0.6 nm and 20 nm, for example, 2.5 nm.

In an embodiment of the present disclosure, both of the magnetization direction of the first ferromagnetic layer 12 and the magnetization direction of the second ferromagnetic layer 14 are in-plane.

In an embodiment of the present disclosure, the cache memory further includes a coupling layer 15.

The coupling layer 15 is arranged between the second ferromagnetic layer 14 and the pinning layer 16 and configured to transfer a pinning effect of the pinning layer 16 to the second ferromagnetic layer 14.

In an embodiment of the present disclosure, a surface of the cache memory is covered with a protective layer, and the protective layer is configured to protect the magnetic tunnel junction from oxidation. A material of the protective layer is a non-magnetic metal or an alloy of doped semiconductor.

Specifically, the non-magnetic metal may be, for example, Ru, Ta, Cuprum (Cu), Pt, Aurum (Au), Ti, and the like, and the doped semiconductor is one or a mixture of p-type Si, n-type Si and the like.

Optionally, a thickness of the protective layer is between 1 nm and 100 μm.

More specifically, the protection layer may also play a role of not being damaged as the number of data writing increases.

In an embodiment of the present disclosure, the pinning layer 16 is a multilayer film structure including at least one antiferromagnetic layer.

Specifically, antiferromagnetic layers may be, for example, IrMn, FeMn, and the like. Since a magnetization direction of the antiferromagnetic layer is not easily disturbed by temperature and surrounding magnetic field, the antiferromagnetic layer may play a role in pinning the second magnetization direction.

Optionally, a total thickness of the pinning layer 16 is between 1 nm and 100 nm.

In an embodiment of the present disclosure, a material of the tunneling layer 13 is a metal oxide, such as magnesium oxide (MgO) and aluminum oxide (ALO), with a thickness between 0.3 nm and 3 nm. MgO of 1.5 nm thickness is selected exemplarily.

Figure 4:
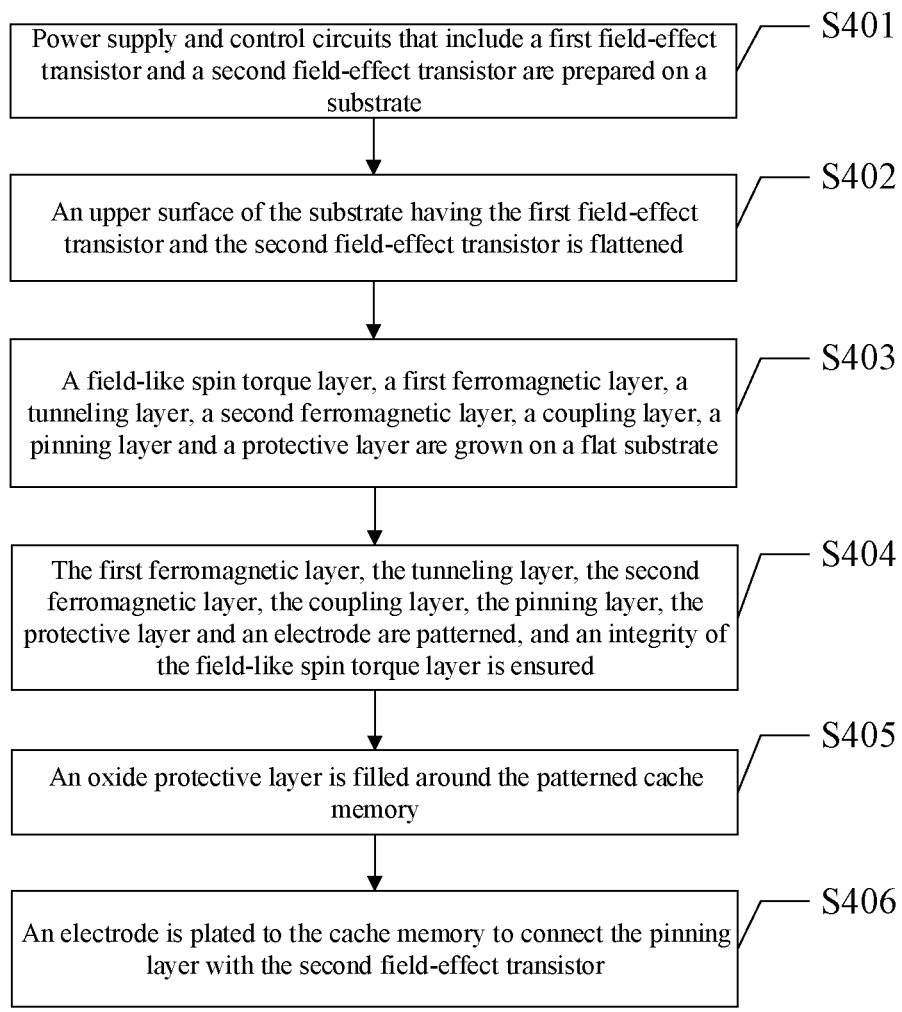
FIG. 4 shows a schematic flowchart of a method of manufacturing the cache memory provided in an embodiment of the present disclosure.

Referring to FIG. 4, FIG. 4 shows a schematic flowchart of a method of manufacturing the cache memory provided in an embodiment of the present disclosure. The cache memory is the cache memory as shown in FIG. 1. The method includes the following steps.

In S401, power supply and control circuits that include a first field-effect transistor and a second field-effect transistor are prepared on a substrate.

The substrate may be a silicon substrate.

In S402, an upper surface of the substrate having the first field-effect transistor and the second field-effect transistor is flattened.

The surface of the silicon substrate may be flattened by polishing and other treatment methods, and a roughness needs to be less than 0.05 nm.

In S403, a field-like spin torque layer, a first ferromagnetic layer, a tunneling layer, a second ferromagnetic layer, a coupling layer, a pinning layer and a protective layer are grown on a flat substrate.

In S404, the field-like spin torque layer, the first ferromagnetic layer, the tunneling layer, the second ferromagnetic layer, the coupling layer, the pinning layer, the protective layer and an electrode are patterned, and an integrity of all layers is ensured.

A cache memory array shown in FIG. 1 is prepared by photolithography, electron beam lithography and ion etching.

In S405, an oxide protective layer is filled around the patterned cache memory.

A thickness of the oxide protective layer is about 100 nm.

In S406, an electrode is plated to the cache memory to connect the pinning layer with the second field-effect transistor. A resistance reading of the magnetic tunnel junction is implemented.

Figure 5:
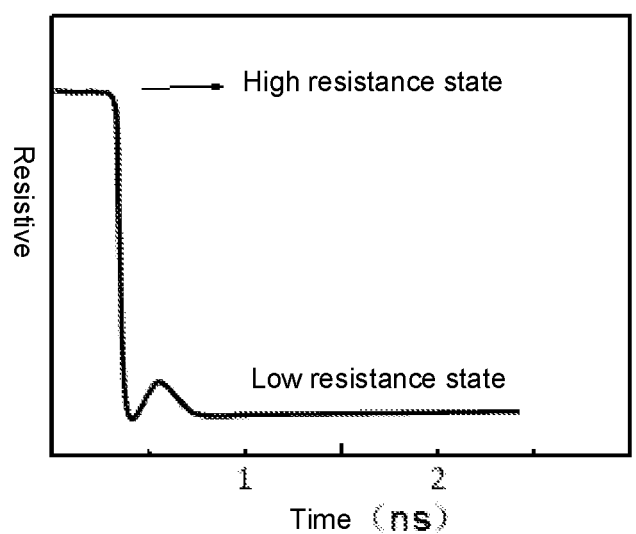
FIG. 5 shows a schematic diagram of a variation of a resistance of a cache memory with time under an action of writing current provided in an embodiment of the present disclosure.

Exemplarily, in an embodiment of the present disclosure, Pt is selected for the field-like spin torque layer, 2.5 nm thick CoFeB is selected for the first ferromagnetic layer, 1.5 nm thick MgO is selected for the tunneling layer, 2 nm thick CoFeB is selected for the second ferromagnetic layer, 0.8 nm Ru is selected for the coupling layer, IrMn/CoFe multilayer film is selected for the pinning layer, 30 nm Pt is selected for the protective layer, 10 nm Ti and 100 nm Ru are selected for the electrode. The above layers are sequentially deposited on the substrate by magnetron sputtering. Deposited samples are subjected to photolithography and ion etching to prepare a core memory with a size of 1 μm×1 μm. FIG. 2 shows a relationship between measured field-like spin torques and an applied current. As shown in FIG. 2, the field-like spin torque and the current are in linear relation. FIG. 3 shows a relationship between a measured memory resistance and an applied writing current. As shown in FIG. 3, the high and low resistance states of the memory may be controlled by the direction of the writing current. FIG. 5 shows a variation of a resistance of a memory with time after applying a writing current. The resistance of the memory may implement the conversion of high and low resistance states in 0.45 nanosecond.

According to the above-mentioned embodiments of the present disclosure, in the cache memory and the method of its manufacture, when a current passes through an interface between the field-like spin torque layer and the ferromagnetic layer, the interface destroys an reversal symmetry at the interface of the first ferromagnetic layer, so that the spin torques generated inside the first ferromagnetic layer no longer cancel each other, thus generating a field-like spin torque (FLT). The field-like spin torque may directly switch the magnetization direction of the first ferromagnetic layer. Since a direction of the field-like transfer torque is related to a direction of the current direction passing through the interface, the switching of the magnetization direction of the first ferromagnetic layer, i.e., the conversion of high and low resistance states, may be implemented by controlling the direction of the current at the interface. Therefore, the effect of the field-like transfer torque on the first ferromagnetic layer is equivalent to applying an external magnetic field. The switching speed is very fast, and a writing process is less than 0.5 nanosecond.

It should be noted that, for simplicity and convenience of description, each of the above-mentioned method embodiments is described as a series of action combinations. However, those skilled in the art should know that the present disclosure is not limited by the described action sequence, because according to the present disclosure, some steps may be performed in other sequences or simultaneously. Secondly, those skilled in the art should know that the embodiments described in the specification are preferred embodiments, and actions and modules involved are not necessarily required for the present disclosure.

In the above-mentioned embodiments, the descriptions of the respective embodiments have respective emphasis, and for parts not detailed in an embodiment, please refer to the relevant description of other embodiments.

The above is a description of a cache memory and a method of its manufacture provided in the present disclosure. For those skilled in the art, according to the idea of embodiments of the present disclosure, there will be changes in the specific embodiments and the scope of application. In summary, the content of the specification should not be interpreted as a limitation of the present disclosure.

What is claimed is:

1. A cache memory, comprising a first field-effect transistor, a field-like spin torque layer underneath a magnetic tunnel junction, an electrode, and a second field-effect transistor sequentially arranged and connected; wherein,
    the first field-effect transistor is configured to provide a writing current and to control the on-off of writing current through a gate electrode;
    the field-like spin torque layer is configured to generate field-like spin torques for switching a first ferromagnetic layer of the magnetic tunnel junction;
    wherein the field-like spin torques are generated when the writing current flows through the field-like spin torque layer and also an interface between the field-like spin torque layer and the first ferromagnetic layer of the magnetic tunnel junction;
    the magnetic tunnel junction comprises a first ferromagnetic layer, a tunneling layer, a second ferromagnetic layer and a pinning layer arranged sequentially, wherein the first ferromagnetic layer is configured to generate a variable first magnetization direction based on the field-like spin torques generated by the underneath field-like spin torque layer; the tunneling layer is arranged between the first ferromagnetic layer and the second ferromagnetic layer; the second ferromagnetic layer is configured to have a fixed second magnetization direction; and the pinning layer is configured to maintain the second magnetization direction;
    the electrode is configured to connect the magnetic tunnel junction with the second field-effect transistor; and
    the second field-effect transistor is configured to control the on-off of the second field-effect transistor through a gate electrode to read resistive states,
    wherein the cache memory further comprises a coupling layer;
    wherein the coupling layer is arranged between the second ferromagnetic layer and the pinning layer, configured to transfer a pinning effect of the pinning layer to the second ferromagnetic layer to avoid a direct coupling between the pinning layer and the second ferromagnetic layer.

2. The cache memory according to claim 1, wherein when a data writing process is performed, the first field-effect transistor is turned on and the second field-effect transistor is turned off; and
    when a data reading process is performed, the first field-effect transistor is turned off and the second field-effect transistor is turned on.

3. The cache memory according to claim 1, wherein both of the magnetization direction of the first ferromagnetic layer and the magnetization direction of the second ferromagnetic layer are in-plane.

4. The cache memory according to claim 1, wherein a material of the field-like spin torque layer is nonferromagnetic, including platinum, tantalum, wolfram, titanium, ruthenium, molybdenum, Cu, RuO, doped semiconductors, or conducting oxides.

5. The cache memory according to claim 1, wherein a thickness of the field-like spin torque layer is between 0.5 nm and 20 nm.

6. The cache memory according to claim 1, wherein each of the first ferromagnetic layer and the second ferromagnetic layer is an alloy or a multilayer heterostructure containing at least one of iron, cobalt, nickel, or boron.

7. The cache memory according to claim 1, wherein a surface of the cache memory is covered with a protective layer;
    the protective layer is configured to protect the cache memory from being affected by oxygen humidity; and
    a material of the protective layer is a non-magnetic metal or an alloy of doped semiconductor.

8. The cache memory according to claim 1, wherein the pinning layer is a multilayer film structure comprising at least one antiferromagnetic layer.

9. A method of manufacturing the cache memory according to claim 1, comprising:
    preparing power supply and control circuits that include a first field-effect transistor and a second field-effect transistor on a substrate;
    flattening an upper surface of the substrate having the first field-effect transistor and the second field-effect transistor;
    growing a field-like spin torque layer, a first ferromagnetic layer, a tunneling layer, a second ferromagnetic layer, a coupling layer, a pinning layer and a protective layer on the flat substrate;
    patterning the field-like spin torque layer, the first ferromagnetic layer, the tunneling layer, the second ferromagnetic layer, the coupling layer, the pinning layer, the protective layer and an electrode, and ensuring an integrity of all layers;

filling an oxide protective layer around the patterned cache memory; and plating an electrode to the cache memory to connect the pinning layer with the second field-effect transistor.

\* \* \* \* \*